United States Patent
Lee et al.

(10) Patent No.: US 6,927,119 B2
(45) Date of Patent: Aug. 9, 2005

(54) SEMICONDUCTOR DEVICE HAVING LANDING PAD AND FABRICATION METHOD THEREOF

(75) Inventors: Yun-Sung Lee, Gyeonggi-do (KR); Joo-Sung Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/767,781

(22) Filed: Jan. 28, 2004

(65) Prior Publication Data

US 2004/0185657 A1 Sep. 23, 2004

(30) Foreign Application Priority Data

Jan. 29, 2003 (KR) ................................ 10-2003-0006023

(51) Int. Cl.$^7$ ......................................... H01L 21/8234
(52) U.S. Cl. ........................ 438/238; 438/596; 438/597
(58) Field of Search ............................... 438/612, 666, 438/596, 597, 241, 253, 396, 399; 257/758, 314, 315, 296

(56) References Cited

U.S. PATENT DOCUMENTS

| | | | | |
|---|---|---|---|---|
| 5,480,814 A | * | 1/1996 | Wuu et al. | 438/279 |
| 5,688,713 A | * | 11/1997 | Linliu et al. | 438/253 |
| 5,728,595 A | * | 3/1998 | Fukase | 438/241 |
| 6,117,757 A | * | 9/2000 | Wang et al. | 438/596 |
| 2002/0001936 A1 | * | 1/2002 | Terauchi et al. | 438/618 |

* cited by examiner

Primary Examiner—Hoai Pham
Assistant Examiner—Nathan W. Ha
(74) Attorney, Agent, or Firm—Marger Johnson & McCollom, P.C.

(57) ABSTRACT

A semiconductor device can be provided comprising a semiconductor substrate having an upper surface. A plurality of adjacent line patterns are formed on the upper surface of the semiconductor substrate. Each line pattern includes a line having a capping layer pattern stacked thereon. A material layer covers the upper surface of the semiconductor substrate having the line patterns. A pad contact hole is located between the line patterns within a region of the material layer. The pad contact hole includes a lower opening between the line patterns and an upper opening located above the lower opening. A barrier layer is formed on a side wall defining the upper opening. A landing pad substantially fills the lower opening and the upper opening defined by the barrier layer.

13 Claims, 7 Drawing Sheets

US 6,927,119 B2

SEMICONDUCTOR DEVICE HAVING LANDING PAD AND FABRICATION METHOD THEREOF

This U.S. nonprovisional patent application claims priority from Korean Patent Application No. 2003-6023, filed on Jan. 29, 2003, the contents of which are incorporated herein by reference in their entirety.

BACKGROUND OF INVENTION

1. Field of the Invention

The present invention relates to a semiconductor device and fabrication method thereof, and more particularly, to a semiconductor device having a landing pad and a fabrication method thereof.

2. Description of Related Art

Generally, semiconductor memory devices can be classified into volatile memory devices and nonvolatile memory devices. The volatile memory devices include a DRAM (Dynamic RAM) and a SRAM (Static RAM). Generally, the DRAM has an integration density higher than the SRAM, which is the reason that the DRAM has been widely used as a memory device for a computer. A unit cell on the cell array region of the DRAM includes a single cell capacitor and a single access transistor.

In response to the increase in the integration density of the DRAM, a DRAM cell having a structural configuration comprising a capacitor over bit line (COB) has been widely employed in order to increase the capacitance of a DRAM capacitor. In this structural configuration, more specifically, the cell capacitor is placed above the bit line. Therefore, the more the integration density of the DRAM is increased, the more difficult it is to form a storage node contact hole for connecting the storage node (lower electrode) of the cell capacitor to the source region of the access transistor.

Recently, in order to increase the ease of formation of the storage node contact hole in a semiconductor fabrication process, a landing pad has been widely employed. The landing pad is interposed between the storage node and the source region.

FIGS. 1 through 4 illustrate a method of forming DRAM cells having landing pads according to the conventional prior art.

Referring to FIG. 1, a trench isolation layer 3 is formed on an active region 3a of a semiconductor substrate 1. A gate insulating layer 5 is also formed on the active region 3a. A conductive layer and a capping layer are sequentially formed on the overall surface of the semiconductor substrate having a gate insulating layer 5. The capping layer and the conductive layer are etched to form a plurality of word line patterns 10 across the upper part of the active region 3a. Accordingly, each of the word lines patterns 10 includes a word line (gate electrode) 7 and a capping layer pattern 9 stacked thereon. Impurity ions are implanted in the active region 3a of the semiconductor substrate 1 using the word line pattern 10 and the trench isolation layer 3 as ion implantation masks to form a first and a second source region 11s', 11s" together with one common drain region 11d. Spacers 13 are formed on the side walls of the word line patterns 10. The capping layer patterns 9 and the spacers 13 are formed of a silicon nitride layer.

Referring to FIG. 2, an interlayer insulating layer 15 is formed on the overall surface of the semiconductor substrate. Then, a bit line pad contact hole 17d, and first and second storage node pad contact holes 17s', 17s", are formed in the interlayer insulating layer 15 to expose the common drain region 11d and the first and the second source regions 11s', 11s", respectively. The interlayer insulating layer 15 is generally formed of a silicon oxide layer. During the formation of the pad contact holes 17d, 17s', 17s", the capping layer pattern 9 and the spacers 13 function as an etching stop layer. At this time, separation layers 15a, which are formed from the interlayer insulating layer 15, are formed between the pad contact holes 17d, 17s', 17s".

Referring to FIG. 3, in order to remove the polymer and the natural oxide layer remaining inside the pad contact holes 17d, 17s', 17s", an oxide layer etching solution is applied on the semiconductor substrate 1 to clean the inside portions of the pad contact holes 17d, 17s', 17s". As a result, the width of the separation layer 15a is reduced. In the event that the cleaning process is performed for an extended time, or for several times, a through hole 15a" may be formed in a predetermined region of the separation layers 15a, or alternatively, the separation layers 15a can be removed. Then, a conductive layer 19 is formed on the overall surface of the semiconductor substrate having the through hole 15a".

Referring to FIG. 4, the conductive layer 19 is planarized to expose the upper surface of the interlayer insulating layer 15, and to form a bit line pad 19d, a first storage node pad 19s' and a second storage node pad 19s". The bit line pad 19d, the first storage node pad 19s' and the second storage node pad 19s" are called "landing pads". If the cleaning process is performed severely, the landing pads 19d, 19s', 19s" are connected to one another as shown in FIG. 4. As described above, it has been difficult to perform the cleaning process of the prior art sufficiently enough to remove the polymer and the natural oxide layer before forming the landing pads. That is, since the severity of the cleaning process is reduced, it is difficult to improve the contact resistance of each of the landing pads.

On the other hand, U.S. Pat. No. 6,117,757 to Chuan-fu Wang and Benjamin Szu-Min Lin ("U.S. '757") is related to a method of forming landing pads for bit line and node contact. As set forth in U.S. '757, gate patterns having a multi-layer are formed on the semiconductor substrate, and first spacers are formed on the side walls of the gate patterns. Next, a first dielectric layer is deposited on the semiconductor substrate having the gate patterns and the first spacers. Contact openings are then formed in the first dielectric layer using a self-aligned method to expose the semiconductor substrate. Next, a second dielectric layer is conformally formed on the overall surface of the semiconductor substrate, and the second dielectric layer is etched back to form second spacers on the side walls of the contact openings. Subsequently, a conductive layer is formed on the overall surface of the semiconductor substrate and patterned to expose the upper portions of the second spacers and to form bit lines and landing pads.

However, with the pitch of the gate patterns being fixed, the formation of the second spacers causes the width of the contact opening to be narrowed. Thus, the contact resistance is increased between the bit lines and the semiconductor substrate, together with between the landing pads and the semiconductor substrate. Furthermore, the method of U.S. '757 may cause a short circuit between the bit lines and the landing pads as the design rule of the semiconductor device is further reduced.

SUMMARY OF THE INVENTION

According to one embodiment of the present invention, a semiconductor device comprises a semiconductor substrate having an upper surface. A plurality of adjacent line patterns are formed on the upper surface of the semiconductor substrate. Each line pattern includes a line having a line capping layer pattern stacked thereon. A material layer covers the upper surface of the semiconductor substrate between adjacent line patterns. A pad contact hole is located between the line patterns along within a region of the material layer. The pad contact hole includes a lower opening between the line patterns and an upper opening located above the lower opening. A barrier layer is formed on a side wall defining the upper opening. A landing pad substantially fills the lower opening and the upper opening and defined by the barrier layer. The semiconductor device can further include line spacers which are formed on the side walls of the line patterns. Preferably, the line patterns and the line spacers are word lines and word line spacers, the line patterns are bit lines, and the line spacers are bit line spacers.

The material layer preferably includes a separation insulating layer and a separation etching stop layer stacked thereon. Moreover, the material layer can include an oxide layer and a nitride layer stacked thereon.

Furthermore, each respective barrier layer and line capping layer pattern is preferably a nitride layer. More preferably, the barrier layers, the line spacers and the capping layer patterns are nitride layers.

In a preferred method of manufacturing a semiconductor device of the present invention, a plurality of adjacent line patterns are formed on the semiconductor substrate. Line spacers are then formed on the side walls of the line patterns, and a material layer is formed on the upper surface of the semiconductor substrate between the adjacent line patterns. Next, a predetermined portion of the material layer is etched to form an upper opening in the material layer between the line patterns, and a barrier layer is formed on a side wall defining the upper opening. Then, the material layer is etched below the upper opening defined by the barrier layer to form a lower opening within the material layer exposing the line spacers between the line patterns. The subject landing pad can then be formed by filling the upper opening and the lower opening, respectively.

In the method of this invention, the formation of the line patterns can comprise sequentially forming a conductive layer and a capping insulating layer on the semiconductor substrate, and sequentially patterning the capping insulating layer and the conductive layer. The material layer can also be formed of a separation insulating layer and a separation etching stop layer stacked thereon. This separation insulating layer is preferably formed of an oxide layer. Moreover, the barrier layer can be formed of an insulating layer. Preferably, if a natural oxide layer and a polymer layer are formed and are present in the lower opening, they are preferably removed prior to forming the landing pad. In the method herein the upper opening can be formed so that it's bottom surface no higher than the upper surface of each of the line patterns.

A preferred method of manufacturing a DRAM cell array region can also be provided. In this method a predetermined region of the semiconductor substrate is filled with a trench isolation layer to form an active region. Then, a plurality of first line patterns are formed on an upper portion of the active region, and a plurality of second line patterns, substantially simultaneously with the formation of the first line patterns, are formed on an upper portion of the trench isolation layer adjacent to at least one side of the active region. At least one second line pattern is formed in parallel with the first line pattern and on a side opposite to the first line pattern. Then, line spacers are formed on side walls of the first and second line patterns, and a material layer is formed covering the upper surface of the semiconductor substrate. A portion of the material layer is then etched to form an upper bit line opening located in a first region between the first line patterns, a first upper storage opening located in a second region between the first and the second line patterns, and a second upper storage opening located in a third region between the first and the second line patterns, respectively. Barrier layers are formed on the side walls defining the upper bit line opening, the first upper storage opening, and the second upper storage opening. Etching of the material layer is provided below the upper bit line opening, the first upper storage opening, and the second upper storage opening defined by the barrier layers, to form respectively a lower bit line opening, a first lower storage opening, and a second lower storage opening, by penetrating the first region, the second region, and the third region to expose the first and second line patterns. A bit line landing pad, a first storage landing pad, and a second storage landing pad are formed by filling the lower and upper bit line openings, the first lower and upper storage openings, and the second lower and upper storage openings, respectively. In the above-described DRAM manufacturing method, the upper bit line opening, the first upper storage opening, and the second upper storage opening can be configured so that their respective bottom surfaces are no higher than the upper surface of each of the first and second line patterns. The material layer can include an oxide layer having a nitride layer stacked thereon, each of the first and second line patterns can include a line having a capping layer pattern stacked thereon, and the barrier layers, the line spacers and the capping layer patterns can be nitride layers.

This invention also relates to a DRAM cell array region. The DRAM cell array region comprises a semiconductor substrate, and a predetermined region of the semiconductor substrate filled with a trench isolation layer to form an active region. A plurality of first line patterns are located on an upper portion of the active region. Moreover, a plurality of second line patterns are formed on an upper portion of the trench isolation layer adjacent to at least one side of the active region. At least one second line pattern is formed in parallel with the first line pattern and on a side opposite to the first line pattern. Line spacers are formed on side walls of the first and second line patterns. A material layer is provided covering the upper surface of the semiconductor substrate.

An upper bit line opening is located in a first region between the first line patterns, a first upper storage opening located in a second region between the first and the second line patterns, and a second upper storage opening located in a third region between the first and the second line patterns. Barrier layers are typically formed on the side walls defining the upper bit line opening, the first upper storage opening, and the second upper storage opening. A lower bit line opening, a first lower storage opening, and a second lower storage opening are formed which penetrate the first region, the second region, and the third region to expose the first and second line patterns. A bit line landing pad, a first storage landing pad, and a second storage landing pad fill the lower and upper bit line openings, the first lower and upper storage openings, and the second lower and upper storage openings respectively.

A DRAM cell array region can be produced in which the material layer includes an oxide layer having a nitride layer stacked thereon. It can also be fabricated so that each of the first and second line patterns include a line having a capping layer pattern stacked thereon. Preferably, the barrier layers, the line spacers and the capping layer patterns are nitride layers. In a further preferred form of this invention, the upper bit line opening, the first upper storage opening, and the second upper storage opening are formed so that their respective bottom surfaces are no higher than the upper surface of each of the first and second line patterns.

BRIEF DESCRIPTION OF THE DRAWINGS

Exemplary embodiments of the present invention will be readily apparent to those of ordinary skill in the art upon review of the detailed description that follows when taken in conjunction with the accompanying drawings, in which like reference numerals denote like parts, and in which.

DETAILED DESCRIPTION OF EXEMPLARY EMBODIMENTS

Reference will now be made in detail to exemplary embodiments of a DRAM cell array region and fabrication method of the present invention, which are illustrated in the accompanying drawings.

Figure 5:
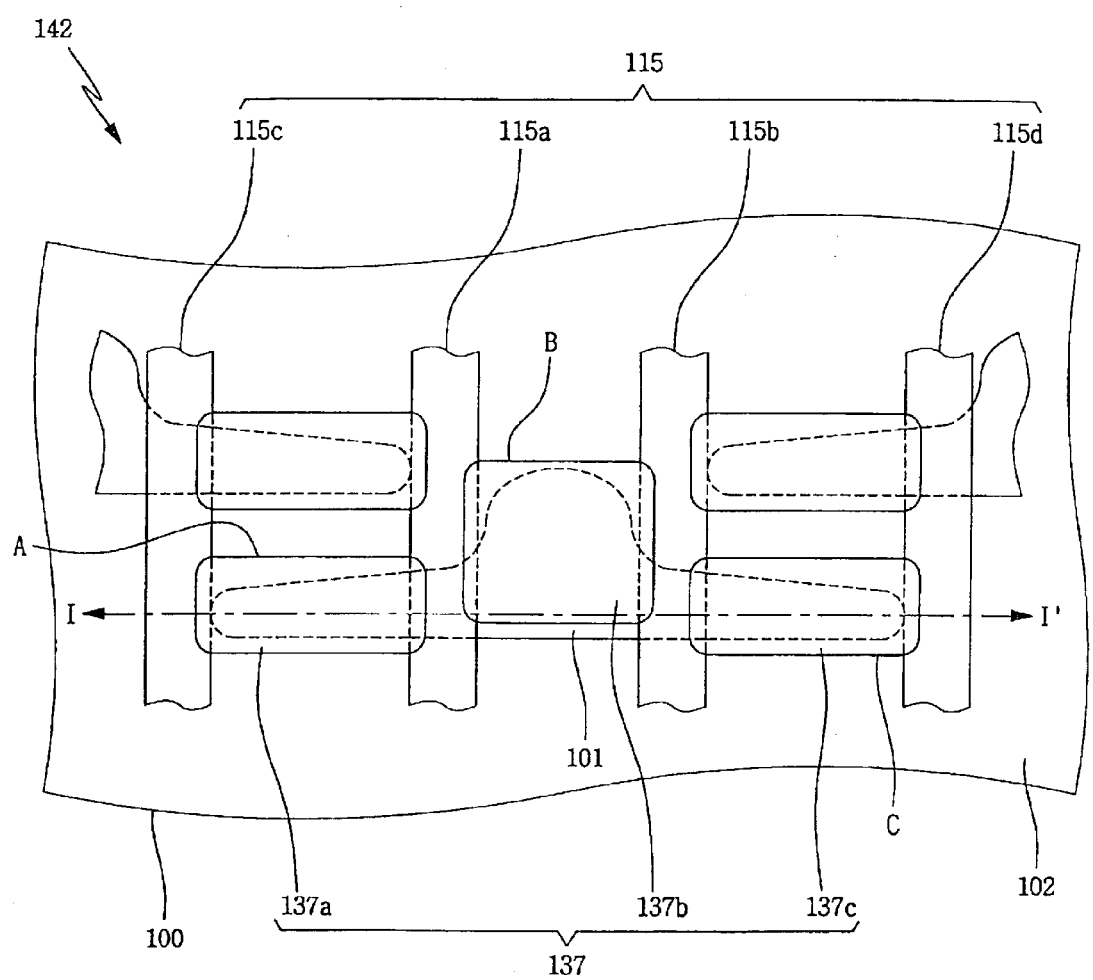
FIG. 5 is a schematic plane view of a DRAM cell array region according to one embodiment of the present invention.
Figure 6:
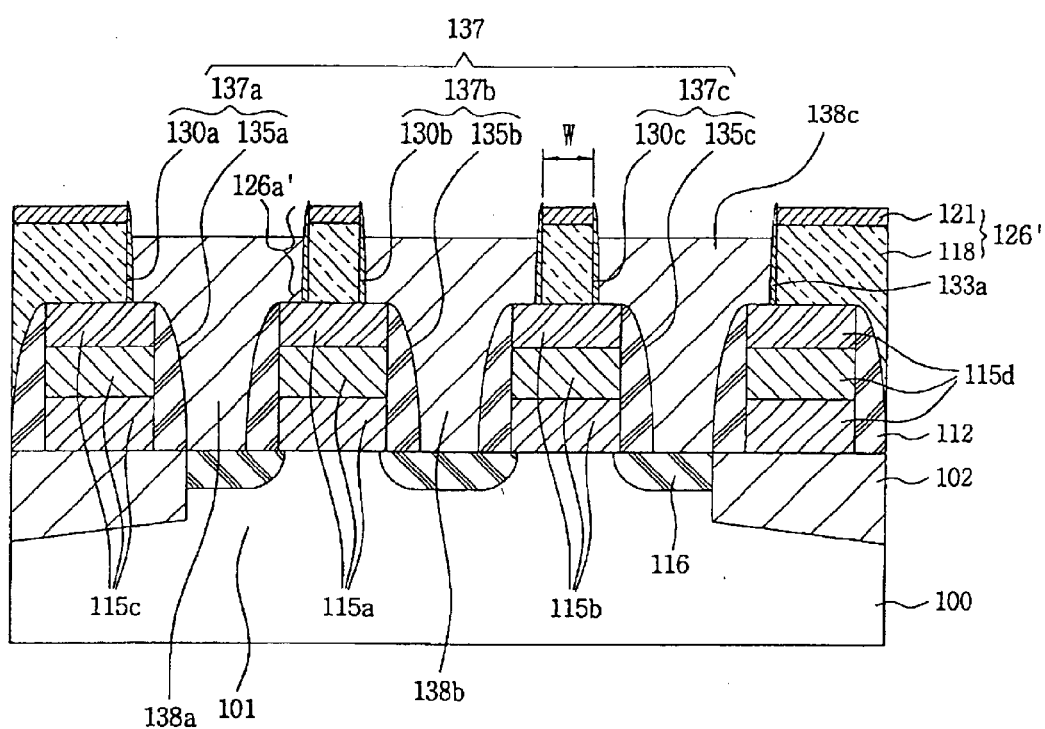
FIGS. 6 to 12 are sectional views to illustrate the processes of a fabrication method of a DRAM cell array region taken along line I–I' of FIG. 5 according to another embodiment of the present invention.

FIG. 5 is a schematic plan view of a part of the DRAM cell array region according to the present invention, and FIG. 6 is a sectional view taken along by line I–I' of FIG. 5. Referring to FIGS. 5 and 6, a trench isolation layer 102 is formed on a predetermined region of a semiconductor substrate 100. The trench isolation layer 102 defines an active region 101. First through fourth respective parallel line patterns 115a, 115b, 115c, 115d are placed across the active region 101. The first and the second line patterns 115a, 115b extend over the upper part of the active region 101, and the third and the fourth line patterns 115c, 115d are located on the trench isolation layer 102 adjacent to the active region 101. The third line pattern 115c is disposed adjacent to the first line pattern 115a, and on the opposite side of first line pattern 115a as second line pattern 115b. Further, the fourth line pattern 115d is located adjacent to the second line pattern 115b, and on the opposite side of second line pattern 115b as first line pattern 115a.

N-type regions 116 are disposed in the semiconductor substrate 100 having the first through fourth line patterns 115a, 115b, 115c, 115d, each of N-type region 116 overlapping the edge of each of the first through fourth line patterns 115, 115b, 115c, 115d. Line spacers 112 are disposed on the side walls of the first through fourth line patterns 115a, 115b, 115c, 115d. Next, a material layer 126' is formed on the semiconductor substrate 100 including the line spacers 112. The material layer 126' comprises the separation insulating layer 118 and the separation etching stop layer 121.

Pad contact holes 137 are introduced in predetermined regions between the first through the fourth line patterns 115a, 115b, 115c, 115d (corresponding to the first to the third regions B, A, C of the material layer 126'). The pad contact holes 137 include a bit line pad contact hole 137b having a lower bit line opening 135b and an upper bit line opening 130b in the first region B, a first storage pad contact hole 137a having a first lower storage opening 135a and a first upper storage opening 130a in the second region A, and a second storage pad contact hole 137c having a second lower storage opening 135c and a second upper storage opening 130c in the third region C. There are barrier layers 133a covering the side walls of the upper bit line opening 130b, the first upper storage opening 130a, and the second upper storage opening 130c.

The bit line pad contact hole 137b, the first storage pad contact hole 137a, and the second storage pad contact hole 137c have a bit line landing pad 138b, a first storage landing pad 138a, and a storage landing pad 138c, respectively.

Figure 7:
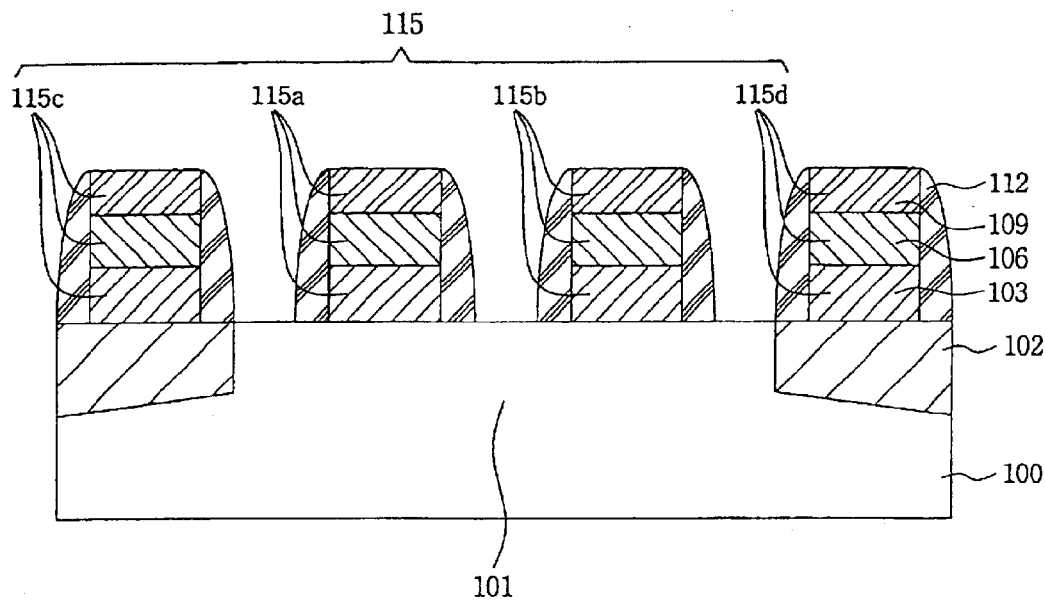
Figure 8:
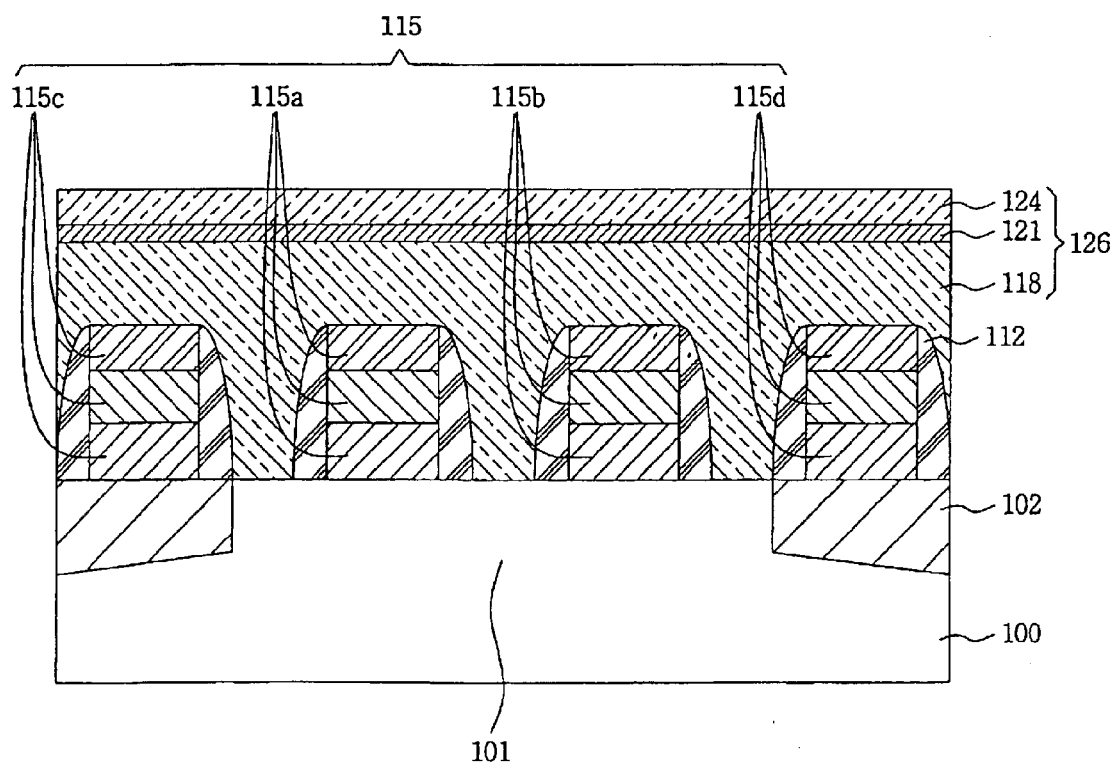

FIGS. 7 to 12 are sectional views to illustrate a fabrication method of a DRAM cell array region taken along line I–I' of FIG. 5 according to one embodiment of the present invention. Referring to FIGS. 7 and 8, a semiconductor substrate having the trench isolation layer 102 to define an active region 101 is prepared. A doped polysilicon layer 103, a WSi layer 106 and a capping insulating layer 109 are formed in sequence on the semiconductor substrate having the active region 101, as well as on the trench isolation layer 102. Then, the capping insulating layer 109, the WSi layer 106 and the doped polysilicon layer 103 in sequence are patterned to form line patterns 115. The doped polysilicon layer 103 and the WSi layer 106 function as line patterns, and the capping insulating layer 109 functions as capping layer patterns. The capping insulating layer 109 is formed of a nitride layer. The line patterns 115 are separately formed on the semiconductor substrate 100 as shown in FIG. 5. A first and a second respective line pattern 115a, 115b is formed which traverses the upper surface of the active region 101. A third line pattern 115c is formed across the upper surface of a trench isolation layer 102 adjacent to a side of the active region 101, in parallel with the first line pattern 115a, and on the opposite side of first line pattern 115a as the second line pattern 115b. A fourth line pattern 115d is formed across the upper surface of another trench isolation layer 102, adjacent to the other side of the active region 101, in parallel with the second line pattern 115b, and on the opposite side of second line pattern 115b as the first line pattern 115a. In the embodiment of the present invention, the line patterns 115 are preferably word line patterns.

A spacer insulating layer (not shown) is conformally formed on the semiconductor substrate having the line patterns 115. The spacer insulating layer is preferably formed of a nitride layer. Then, the spacer insulating layer is etched to form line spacers 112 on the side walls of the line patterns 115. In the embodiment of the present invention, the line spacers 112 are preferably word line spacers. The line patterns 115 and the line spacers 112 may preferably be bit line patterns and bit line spacers.

A material layer 126 is formed on the semiconductor substrate having the line patterns 115 and the line spacers 112. The material layer 126 is formed of a separation insulating layer 118, a separation etching stop layer 121, and an interlayer insulating layer 124, respectively. The separation etching stop layer 121 preferably has an etching selectivity with respect to the separation insulating layer 118. Preferably, the separation insulating layer 118 is formed of an oxide layer and the separation etching stop layer 121 is formed of a nitride layer. The thickness of the separation insulating layer 118 is preferably formed to be greater than that of the interlayer insulating layer 124. The separation insulating layer 118 is formed to the thickness sufficient to cover the line patterns 115 and the line spacers 112, and extends upwardly from the top surface of the line pattern 115.

Figure 9:
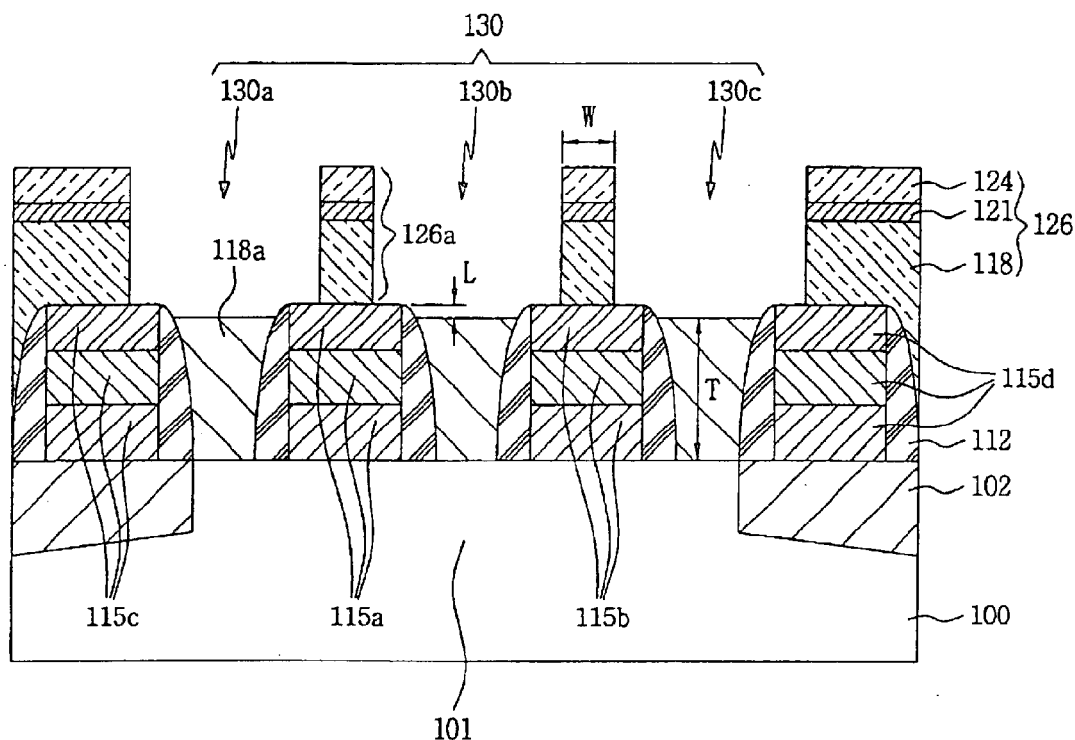

Referring to FIG. 9, a photoresist layer (not shown) is deposited on the semiconductor substrate having the material layer 126 of FIG. 8. Photoresist patterns are formed on the photoresist layer by using the known photo process to align between the first to the fourth line patterns 115a, 115b, 115c, 115d corresponding to the first to the third regions B, A, C. The material layer 126 exposed through the photoresist patterns is partially etched to form upper openings 130, wherein a predetermined portion of each of the top surfaces of the line patterns 115 is exposed through the upper openings 130.

The upper openings are separately formed as follows: An upper bit line opening 130b is formed on a predetermined region between the first and the second line patterns 115a, 115b corresponding to the first region B of the material layer 126. At the same time, a first upper storage opening 130a is formed on a predetermined region between the first and the third line patterns 115a, 115c corresponding to the second region A of the material layer 126. With the formation of the upper bit line opening 130b and the first upper storage opening 130a, a second upper storage opening 130c is formed on a predetermined region between the second and the fourth line patterns 115b, 115d corresponding to the third region C of the material layer 126. Further, the upper bit line opening 130b, the first upper storage opening 130a, and the second upper storage opening 130c are formed to have a bottom surface of the same height or less as the upper surface of each of the line patterns 115a, 115b, 115c, 115d.

Each of the upper openings 130 is separated into an isolation layer 126a with a width W which is formed of the material layer 126, on the top surface of each of the line patterns 115a–115c. At this time, insulating layer patterns 118a are formed between the line patterns 115a–115c under the upper openings 130a, 130b, 130c. The insulating layer patterns 118a are formed by partially etching the separation insulating layer 118 of FIG. 8. The insulating layer patterns 118a are preferably recessed to a depth L, toward the semiconductor substrate 100, below the upper surfaces of the line patterns 115a–115c. The purpose of this recessed depth L is to prevent the increase of the contact resistance of each of pad contact holes 137 of FIG. 5 formed by the sequential etching of the insulating layer patterns 118a during the semiconductor formation process. Therefore, the thickness T and the depth L of the insulating layer patterns 118a can be measured for the purpose of checking the contact resistances of the pad contact holes 137.

Figure 10:
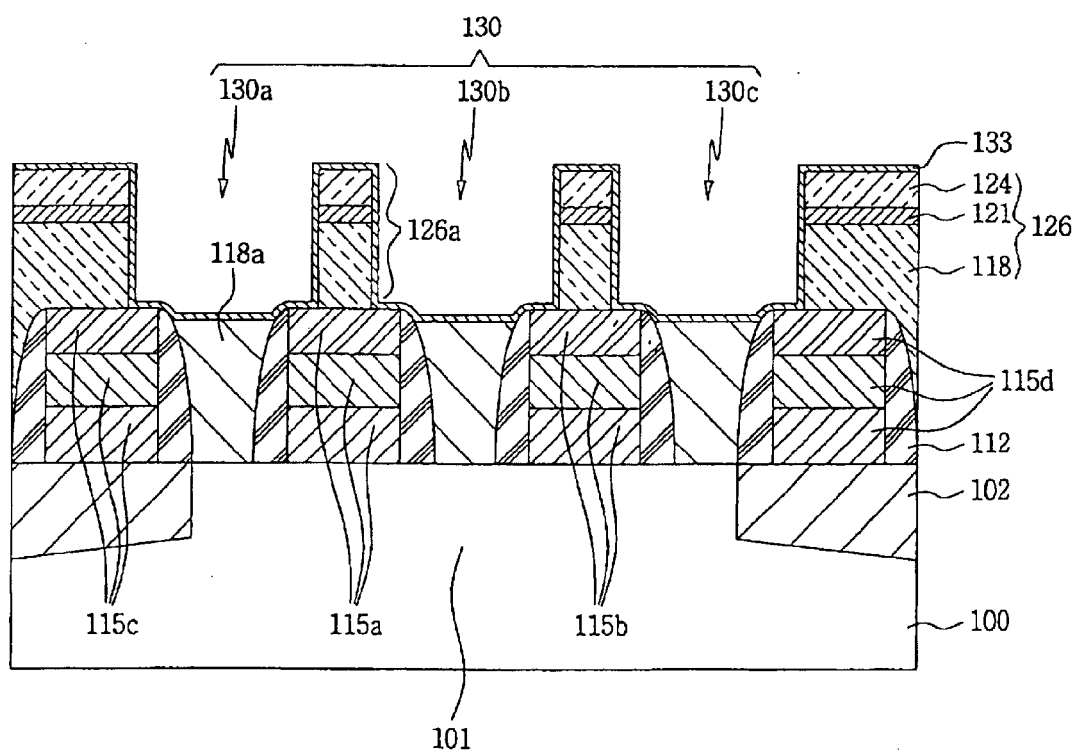
Figure 11:
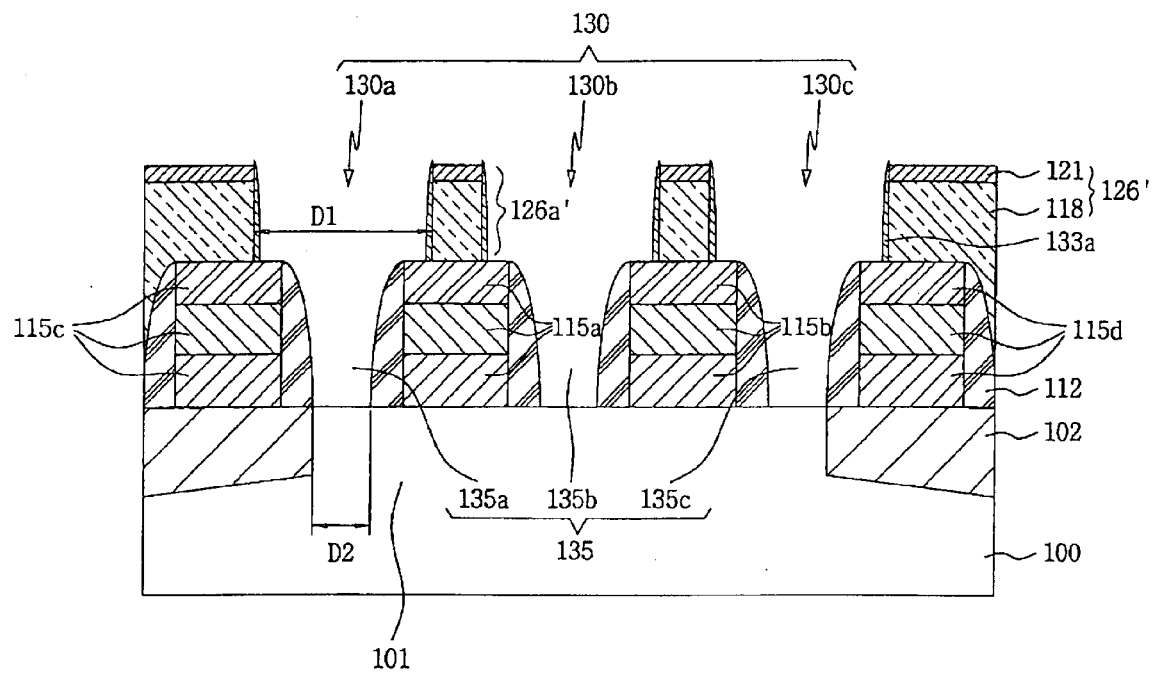

Referring to FIGS. 10 and 11, a barrier insulating layer 133 is conformally formed on the surface of the semiconductor substrate having the upper openings 130. The barrier insulating layer 133 is etched back to form barrier layers 133a on the side walls of the respective upper bit line opening, the first upper storage opening, and the second upper storage opening 130b, 130a, 130c. Sequentially insulating layer patterns 118a are etched to form lower openings 135 between the line patterns 115a–115c which exposes the semiconductor substrate 100, and further forms the barrier layers 133a.

The lower openings 135 are formed of a lower bit line opening 135b, a first lower storage opening 135a and a second lower storage opening 135c. The lower bit line opening 135b is formed by etching the insulating layer pattern 118a under the upper bit line opening 130b to penetrate the region between the first and the second line patterns 115a, 115b. The first lower storage opening 135a is formed by etching the insulating layer pattern 118a under the first upper storage opening 130a to penetrate the region between the first and the third line patterns 115a, 115c. The second lower storage opening 135c is formed by etching the insulating layer pattern 118a under the second upper storage opening 130c to penetrate the region between the second and the fourth line patterns 115b, 115d, along with the formation of the lower bit line opening 135b and the first lower storage opening 135a.

Further, the upper openings 130 in FIG. 9 are separately by a material layer 126 and an isolation layer 126a including an interlayer insulating layer 124. However, after the formation of the lower openings 135a, 135b, 135c, the respective upper openings 130a, 130b, 130c are separately by a material layer 126' and an isolation layer 126a' in which the interlayer insulating layer 124 is removed together with the insulating layer pattern 118a. The separation etching stop layer 121 is a buffer layer for preventing the separation insulating layer 118 from being etched during the formation of the lower openings 135a, 135b, 135c. Therefore, the lower openings 135a, 135b, 135c are formed through the self alignment method using the upper openings 130a, 130b, 130c of FIG. 9 and the barrier insulating layers 133 of FIG. 10.

The diameter D1 of each of the upper openings 130a, 130b, 130c is greater than the diameter D2 of each of the lower openings 135a, 135b, 135c measured across the line patterns 115a, 115b, 115c, 115d. And the upper openings 130 are formed to overlap between the line patterns 115. Preferably, the residue existing between the line spacers 112, after the formation of the lower openings 135a, 135b, 135c, needs to be cleaned in order to reduce the electrical resistance.

The reason for recessing the insulating layer pattern 118a by the thickness L as shown in FIG. 9, is to prevent the residue of the barrier insulating layer 133 from being generated in the junction of the side wall of each of the line spacers 112, and on the upper surface of each of the insulating layer patterns 118a during the formation of the barrier layer 133a. The residue of the barrier insulating layer 133 can cause the diameter D2 of each of the lower openings 135a, 135b, 135c to be reduced.

Figure 12:
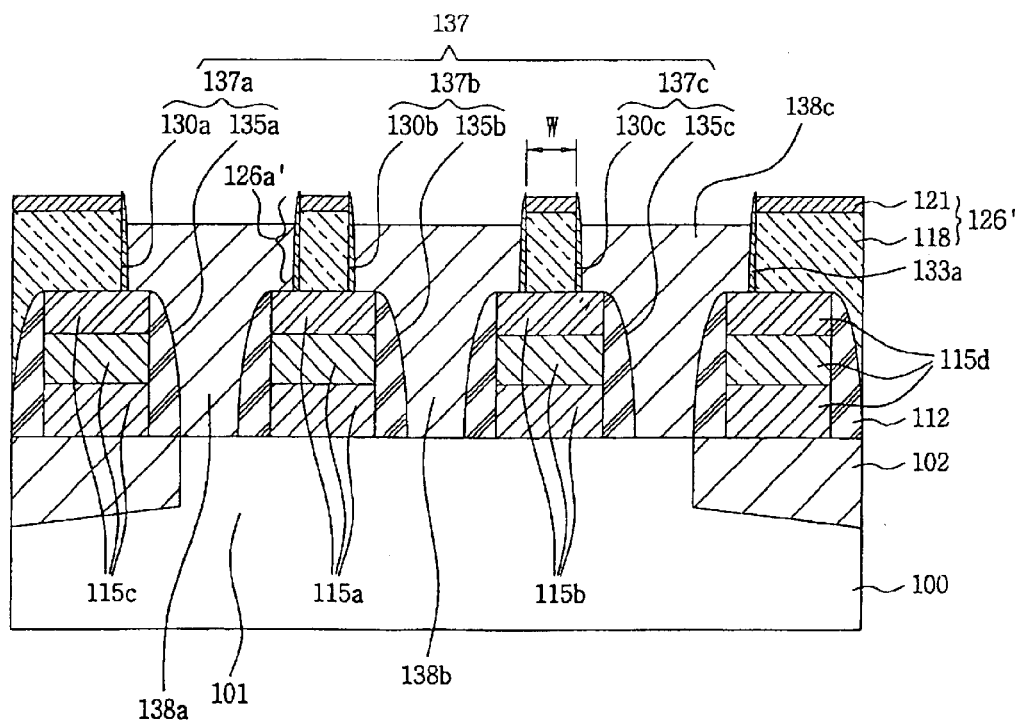

Referring to FIG. 12, pad contact hole 137 is formed of a bit line pad contact hole, a first storage pad contact hole and a second storage pad contact hole 137b, 137a, 137c, respectively, as follows. The bit line pad contact hole 137b is formed of the lower bit line opening 135b and the upper bit line opening 130b, between the first and the second line patterns 115a, 115b, which corresponding to the first region B of FIG. 5. The first storage pad contact hole 137a is formed of the first lower storage opening 135a and the first upper storage opening 130a between the first and the third line patterns 115a, 115c, which corresponds to the second region A of FIG. 5. With the formation of the bit line pad contact hole 137b and the first storage pad contact hole 137a, respectively, a second storage pad contact hole 137c is formed of a second lower storage opening 135c and the second upper storage opening 130c between the second and the fourth line patterns 115b, 115d, which corresponds to the third region C of FIG. 5.

Further, a doped pad layer (not shown) is formed to a predetermined thickness on the semiconductor substrate having the pad contact holes 137. The doped pad layer is etched by using the known chemical mechanical polishing method to form landing pads 138a–138c filling the pad contact holes 137.

The landing pads 138a–138c comprise a bit line landing pad 138b, a first storage landing pad 138a, and a second storage landing pad 138c as follows. That is, the bit line landing pad 138b, the first storage landing pad 138a, and the second storage landing pad 138c fill the bit line pad contact hole 137b, the first storage pad contact hole 137a, and the second storage pad contact hole 137c, respectively. The separation etching stop layer 121 is used as an etching buffer layer. Each of the landing pads 138a–138c are controlled to be lower than the height of the isolation layer 126a' or the height of the material layer 126'. The landing pads 138a–138c are preferably controlled to be lower than the bottom surface of the separation etching stop layer 121 in order to prevent from making the short circuit between the landing pads 138a–138c.

Further, a wet etching process for cleaning the semiconductor substrate 100 is performed between the formation step of the pad contact holes 137 and the deposition step of the pad layer. The wet etching process can remove the by-products and particles generated when etching the insulating layer pattern 118a of FIG. 10, and a natural oxide layer, etc. generated in the lower openings 135a, 135b, 135c. The isolation layer 126a' and/or the material layer 126' may be etched by using a conventional wet etching process.

However, the barrier layers 133a function as buffer layers during the wet etching process so that the separation etching stop layer 121 and the separation insulating layer 118 are not etched. The use of the barrier layers 133a and the separation etching stop layer 121 makes the isolation layer 126a' maintain substantially the same width W as the isolation layer 126a of FIG. 9.

As described above, according to the semiconductor device and the cell array region, and the fabrication method thereof of the present invention, the separation etching stop layer along with the barrier layers prevent the separation insulating layer from being etched between the formation step of the pad contact holes and the deposition step of the pad layer. Accordingly, the semiconductor device includes the landing pad free of the short circuit through the barrier layers and the separation etching stop layer. Therefore, the DRAM cell array region having the barrier layers and the separation etching stop layer can maintain the width W uniformly between the pad contact holes, so that the semiconductor device of this invention has the ability to retain the cell data for a much longer time than in conventional semiconductors. As a result, the data retention characteristics of the subject semiconductor device are significantly improved.

While the present invention has been particularly shown and described with reference to exemplary embodiments thereof, it will be understood by those skilled in the art that the foregoing and other changes in form and details may be made therein without departing from the spirit and scope of the present invention.

What is claimed is:

1. A method of manufacturing a semiconductor device comprising:

providing a semiconductor substrate;

forming a plurality of adjacent line patterns on the semiconductor substrate;

forming line spacers on the side walls of the line patterns;

forming a material layer on the upper surface of the semiconductor substrate between the adjacent line patterns;

etching a predetermined portion of the material layer to form an upper opening in the material layer between the line patterns;

forming a barrier layer on a side wall defining the upper opening;

etching the material layer below the upper opening defined by the barrier layer to form a lower opening within the material layer exposing the line spacers between the line patterns; and forming a landing pad by filling the upper opening and the lower opening, respectively.

2. The manufacturing method of claim 1, wherein the formation of the line patterns comprises:

sequentially forming a conductive layer and a capping insulating layer on the semiconductor substrate; and sequentially patterning the capping insulating layer and the conductive layer.

3. The manufacturing method of claim 1, wherein the material layer is formed of a separation insulating layer and a separation etching stop layer stacked thereon.

4. The manufacturing method of claim 3, wherein the separation insulating layer is formed of an oxide layer.

5. The manufacturing method of claim 1, wherein the barrier layer is formed from an insulating layer.

6. The manufacturing method of claim 1, further comprising removing a natural oxide layer and a polymer layer formed in the lower opening, if present, prior to forming the landing pad.

7. The manufacturing method of claim 1, wherein the upper opening is formed so that its bottom surface is no higher than the upper surface of each of the line patterns.

8. A method of manufacturing a DRAM cell array region comprising:

providing a semiconductor substrate;

filling a predetermined region of the semiconductor substrate with a trench isolation layer to form an active region;

forming a plurality of first line patterns on an upper portion of the active region;

forming a plurality of second line patterns, substantially simultaneously with the formation of the first line patterns, on an upper portion of the trench isolation layer adjacent to at least one side of the active region, wherein at least one second line pattern is formed in parallel with the first line pattern and on a side opposite to the first line pattern;

forming line spacers on side walls of the first and second line patterns;

forming a material layer covering the upper surface of the semiconductor substrate;

etching a portion of the material layer to form an upper bit line opening located in a first region between the first line patterns, a first upper storage opening located in a second region between the first and the second line patterns, and a second upper storage opening located in a third region between the first and the second line patterns, respectively;

forming barrier layers on the side walls defining the upper bit line opening, the first upper storage opening, and the second upper storage opening;

etching the material layer below the upper bit line opening, the first upper storage opening, and the second upper storage opening defined by the barrier layers, to form respectively a lower bit line opening, a first lower storage opening, and a second lower storage opening, by penetrating the first region, the second region, and the third region to expose the first and second line patterns; and forming a bit line landing pad, a first storage landing pad, and a second storage landing pad by filling the lower and upper bit line openings, the first lower and upper storage openings, and the second lower and upper storage openings respectively.

9. The manufacturing method according to claim 8, wherein the upper bit line opening, the first upper storage opening, and the second upper storage opening are formed so that their respective bottom surfaces are no higher than the upper surface of each of the first and second line patterns.

10. The manufacturing method according to claim 8, wherein the material layer includes an oxide layer having a nitride layer stacked thereon.

11. The manufacturing method according to claim 8, wherein each of the first and second line patterns includes a line having a capping layer pattern stacked thereon.

12. The manufacturing method according to claim 8, wherein the barrier layers and the line spacers are a nitride layer.

13. The manufacturing method according to claim 11, wherein the capping layer pattern is a nitride layer.

* * * * *

UNITED STATES PATENT AND TRADEMARK OFFICE
CERTIFICATE OF CORRECTION

PATENT NO. : 6,927,119 B2 Page 1 of 1
APPLICATION NO. : 10/767781
DATED : August 9, 2005
INVENTOR(S) : Lee et al.

Figure 1:
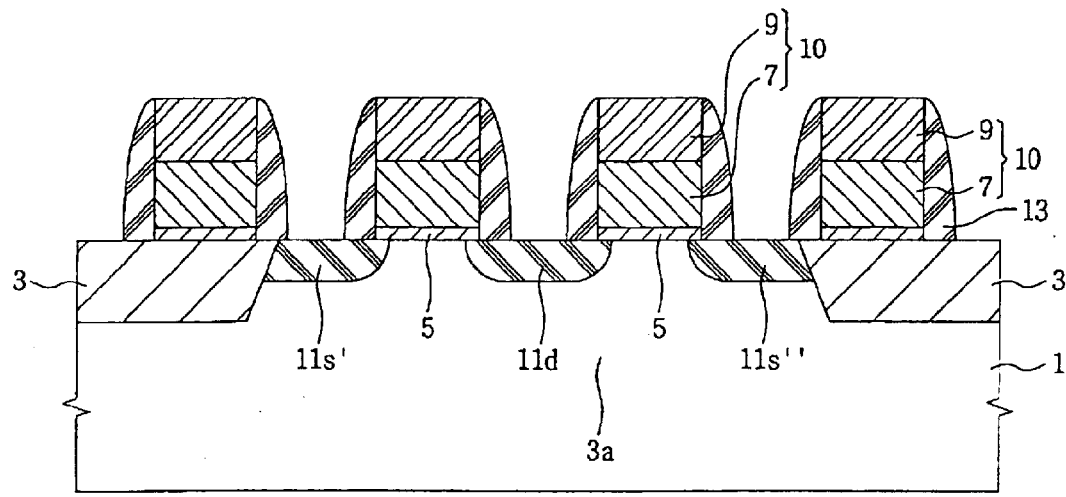
FIGS. 1 to 4 are schematic sectional views to illustrate a method of forming DRAM cells having landing pads according to the prior art.
Figure 2:
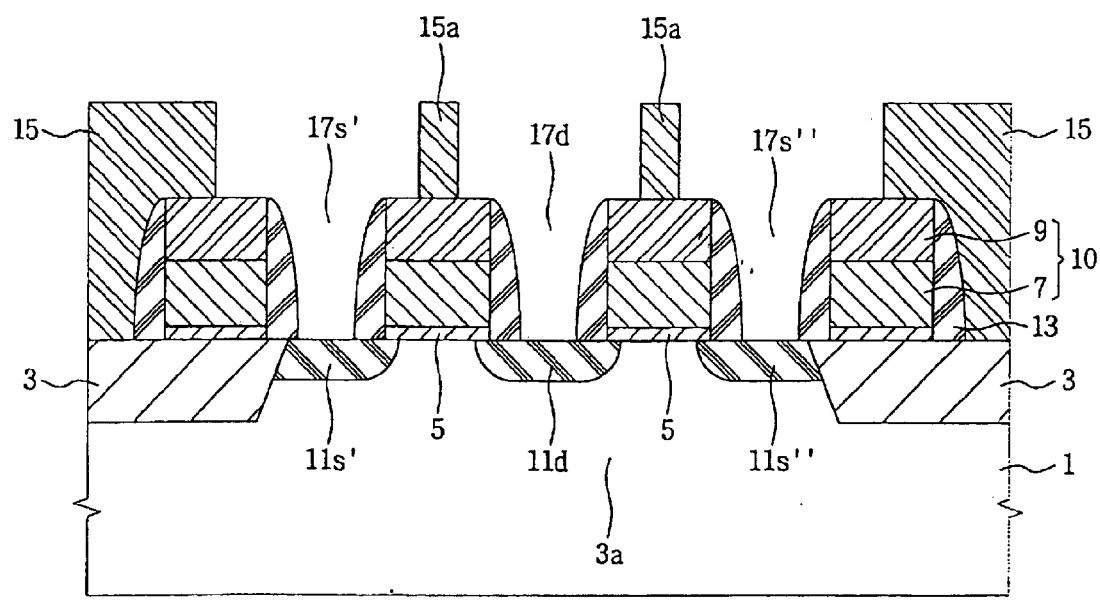
Figure 3:
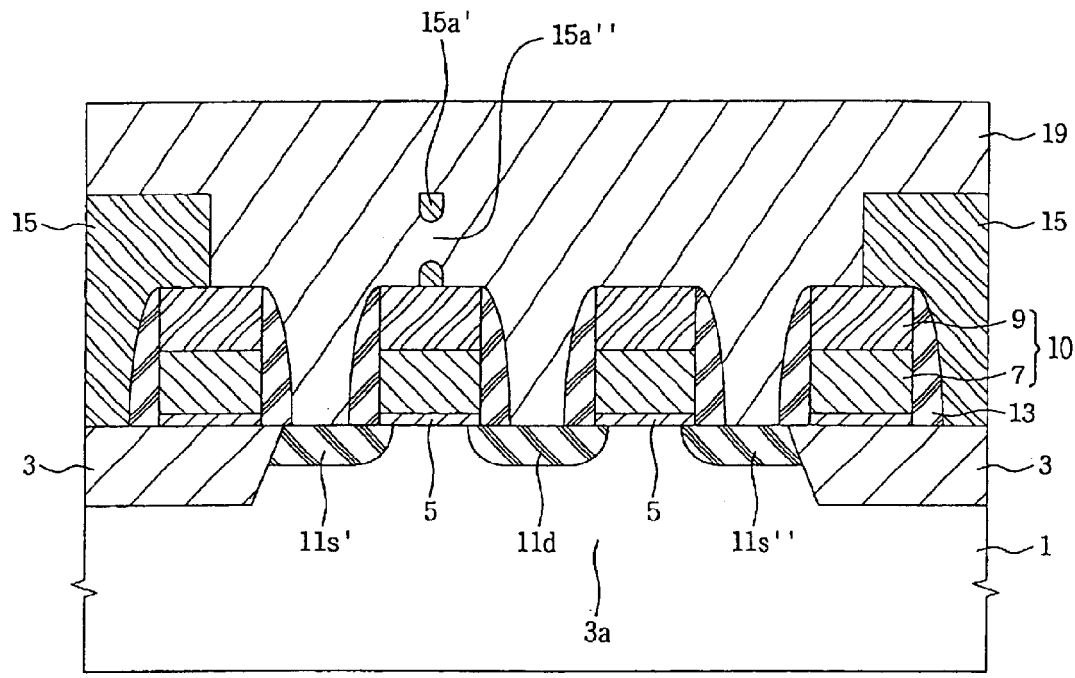
Figure 4:
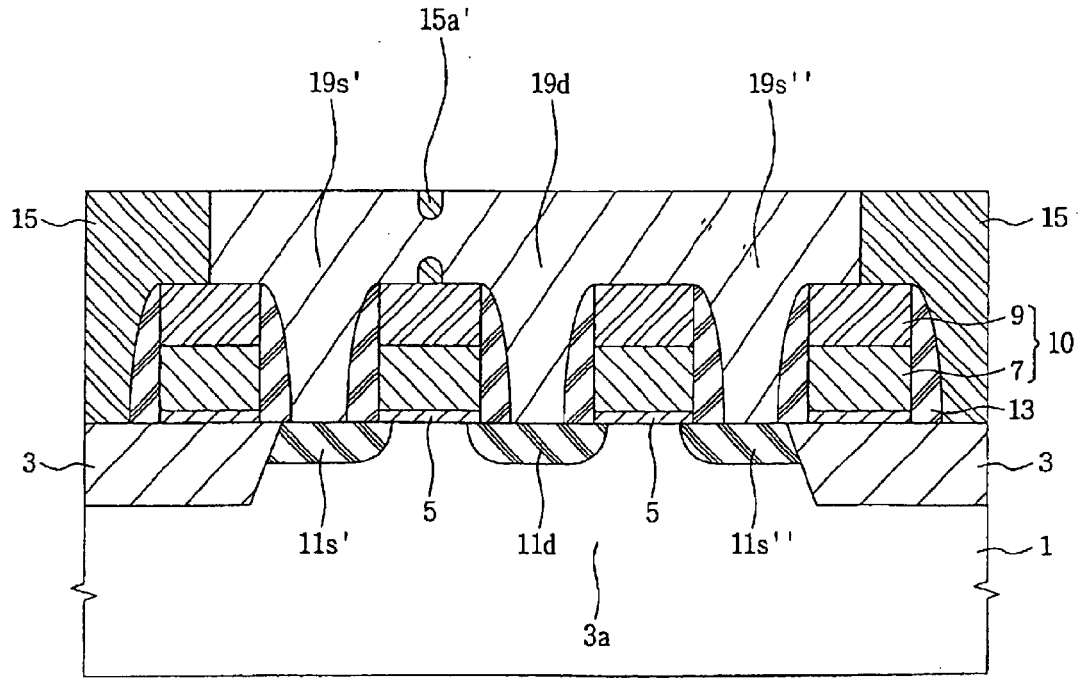

It is certified that error appears in the above-identified patent and that said Letters Patent is hereby corrected as shown below:

Column 2, line 30, please replace "FIG. 4. As" with --FIG. 4. ¶ As--
Column 3, line 12, please replace "and defined" with --and is defined--
Column 3, line 54, please replace "it's" with --its--
Column 3, line 55, please replace "surface no higher" with --surface is no higher--
Column 4, lines 62 and 63, please replace "openings respectively." with --openings, respectively.--
Column 5, line 56, please replace "**115, 115*b*, 115*c*, 115*d*." with --115*a*, 115*b*, 115*c*, 115*d*.**--
Column 7, line 13, please replace "130*b*is" with --130*b* is--
Column 7, line 15, please replace "115*b*corresponding" with --115*b* corresponding--
Column 8, line 7, please replace "separately" with --separated--
Column 8, line 11, please replace "separately" with --separated--
Column 8, line 47, please replace "which corresponding" with --which corresponds--
Column 11, line 3, please replace "openings respectively" with --openings, respectively--

Signed and Sealed this

Sixth Day of February, 2007

JON W. DUDAS
*Director of the United States Patent and Trademark Office*